United States Patent
Ito

(10) Patent No.: US 6,384,434 B1
(45) Date of Patent: May 7, 2002

(54) SEMICONDUCTOR DEVICE HAVING MULTIPLE TYPES OF OUTPUT CELLS

(75) Inventor: Satoshi Ito, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/599,358

(22) Filed: Jun. 21, 2000

(51) Int. Cl.<sup>7</sup> ............................................... H01L 27/10
(52) U.S. Cl. ..................... 257/203; 257/204; 257/206
(58) Field of Search ................................ 257/203, 204, 257/206

(56) References Cited

U.S. PATENT DOCUMENTS 6,177,691 B1 * 1/2001 Iranmanesh et al. ........ 257/211
6,177,709 B1 * 1/2001 Iranmanesh ................. 257/390

\* cited by examiner

*Primary Examiner*—Ngâ V. Ngô
(74) *Attorney, Agent, or Firm*—Hogan & Hartson, L.L.P.

(57) ABSTRACT

A semiconductor device of which input/output cells can be made smaller and consequently of which chip area and hence cost can be reduced in the case where different driving capabilities are required for the output cells. A plurality of transistors is formed in each output cell by forming a plurality of gate electrodes on the semiconductor substrate through a gate-insulating film and by forming a plurality of diffusion regions on both sides of each gate electrode. An endmost impurity-diffusion region is divided into a plurality of divisional diffusion regions in the direction of the gate width, and a plurality of transistors having a gate electrode in common is thereby formed. The gate widths of these transistors, which have a gate electrode in common, are smaller than those of other transistors. Therefore, by using at least one of the transistors having the gate in common, an output driver with low current driving capability can be constituted.

26 Claims, 6 Drawing Sheets

SEMICONDUCTOR DEVICE HAVING MULTIPLE TYPES OF OUTPUT CELLS

BACKGROUND OF THE INVENTION

1. Field of the Invention

The present invention relates to a semiconductor device, particularly to a semiconductor device having at least two types of output cells including an output cell with high driving capability and an output cell with low driving capability.

2. Description of Background Art

In a semiconductor integrated circuit such as a gate array device or an embedded array device, driving capability required for each input/output cell may be different. In the input/output cells for which high driving capability is required, large transistors must be used for the output driver. When such large transistors are used in the input/output cells for which low driving capability is required, noises such as overshoots or undershoots increase when the signal changes. Driving capability can be restrained by connecting a diffusion resistor in series to the output line of the large transistors. However, this requires an area for forming the diffusion resistor, thereby increasing the area for the input/output cells. Moreover, this causes rising or falling characteristics of the signals to deteriorate. Therefore, small transistors have been used for output drivers in input/output cells for which low driving capability is required to achieve the required driving capability.

In the case of full-custom semiconductor devices, driving capability of each input/output cell has been determined when manufacturing a bulk substrate. Therefore, transistors with the required sizes are fabricated in each input/output cell.

However, in the case of master-slice semiconductor devices in which a lot of transistors is fabricated in a bulk substrate in advance, wiring of the lot of transistors is determined afterward according to the logic and capabilities required by the customer. This applies not only to the internal cell region positioned at the center of the semiconductor device, but also to the input/output cells disposed around the internal cell region.

Therefore, for master-slice semiconductor devices, a plurality of transistors with a large gate width and at least one transistor with a small gate width must be previously placed in each input/output cell. High driving capability can be obtained by connecting the transistors with a large gate width in parallel. By using only the transistor with a small gate width, driving capability smaller than the driving capability obtained by using one transistor with a large gate width can be obtained.

However, conventional master-slice semiconductor devices need two or more types of transistors with different gate widths according to the driving capability required for each input/output cell to be fabricated. This increases the area required for each input/output cell as well as cost due to the complicated design.

SUMMARY OF THE INVENTION

Accordingly, an object of the present invention is to provide a semiconductor device capable of reducing cost by downsizing input/output cells, thereby reducing the chip area when the driving capability required for each input/output cell differs.

One aspect of the present invention provides a master-slice semiconductor device in which a lot of transistors are formed on a semiconductor substrate, transistors selected from the lot of transistors being connected by wiring, the master-slice semiconductor device comprising an input/output cell region disposed in a peripheral part of the semiconductor device and an internal cell region disposed inside the input/output cell region. A plurality of output cells are disposed in the input/output cell region. An output terminal and a plurality of transistors are disposed in each of output cells, with at least one transistor selected from the plurality of transistors being connected to the output terminal. Each of the plurality of transistors comprises: a gate electrode formed on the semiconductor substrate through a gate-insulating film; and two diffusion regions formed at the semiconductor substrate on both sides of the gate electrode. And one of the diffusion regions of at least one of the plurality of transistors is divided into a plurality of divisional diffusion regions in a direction of the width of the gate electrode.

According to this aspect of the present invention, by separating the impurity diffusion region into a plurality of divisional diffusion regions, the transistor can be divided to correspond to each of the divisional diffusion regions. The gate width of the transistor, including a divisional diffusion region, is less than that of other transistors including the diffusion regions which are not divided. Therefore, an output driver with low current driving capability can be constituted by using a transistor with a small gate width. The transistors with the divided impurity-diffusion region can be made to have the same current driving capability as other transistors by using the divisional diffusion regions together as a common drain. Therefore, an output driver with higher current driving capability can be constituted by connecting two or more transistors in parallel.

By thus dividing an impurity-diffusion region, the transistor with the divisional diffusion region can be used as a transistor with a small gate width or a transistor with a standard gate width. It is therefore unnecessary to separately form a transistor with a small gate width. Consequently, an area for input/output cells, and hence the chip area can be reduced.

An element isolation region may be disposed between the adjacent divisional diffusion regions. The divisional diffusion regions are thereby separated.

The other of the diffusion regions on both sides of the gate electrode may have a region divided by the element isolation region at a portion near the gate electrode. A region other than the divided region may be continuous in the direction of the gate width. This prevents charge transfer between adjacent divisional diffusion regions. Moreover, a part continuous in the direction of the gate width can be left in the other diffusion region. Since this region is used as a common source by wiring, it is unnecessary to divide this region completely. The element isolation region may be formed of an element isolating insulation film.

It is preferable that the gate electrode of each of the plurality of transistors is disposed in parallel, and impurity-diffusion regions between two gate electrodes are used as one of a common source and a common drain of two transistors. By this configuration, a plurality of transistors can be disposed closely, thereby reducing the area for the output cells. The plurality of divisional diffusion regions are preferably formed in an endmost impurity diffusion region. This is because only the transistor with the gate electrode at the end can be divided into a plurality of transistors. However, not only the endmost impurity-diffusion region but also the region between any two parallel gate electrodes may be divided. In this case, two transistors consisting of two gate electrodes and the impurity-diffusion regions on both sides thereof are divided.

One of the divisional diffusion regions having the smallest width may form a transistor having the smallest current driving capability together with the electrode and the other of the diffusion regions. Therefore, an output transistor with the smallest driving capability can be constituted by using only this transistor.

The widths of the each of the divisional diffusion regions may be the same or different.

At least one of the divisional diffusion regions in at least one of the output cells may be a drain region to be connected to the output terminal by wiring. By using the divisional diffusion region as the drain, the transistor can be used as an output driver.

Each of the output cells may comprise: a first output driver disposed between the output terminal and a VDD potential supply line; and a second output driver disposed between the output terminal and a VSS potential supply line. The first output driver may be formed by wiring at least one transistor selected from a plurality of p-type transistors. The second output driver may be formed by wiring at least one transistor selected from a plurality of n-type transistors.

According to another aspect of the present invention, in a master-slice semiconductor device in which a lot of transistors are formed on a semiconductor substrate, transistors selected from the lot of transistors being connected by wiring, each of the lot of transistors comprises: a gate electrode formed on the semiconductor substrate through a gate-insulating film; and two diffusion regions formed at the semiconductor substrate on both sides of the gate electrode. One of the diffusion regions of at least one of the lot of transistors is divided into a plurality of divisional diffusion regions in a direction of the width of the gate electrode.

In this aspect of the present invention, the transistor with the divisional diffusion region may be formed not only in the input/output cells, but also in the internal cell or the like.

DESCRIPTION OF THE PREFERRED EMBODIMENT

Embodiments of the present invention will be described with reference to the drawings.

Figure 5:
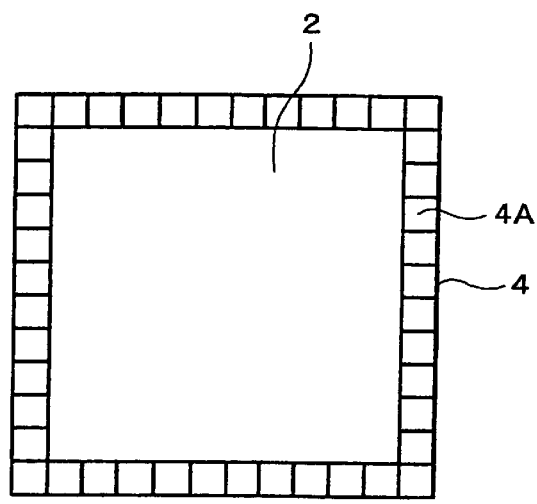
FIG. 5 is a plan view showing a semiconductor device according to an embodiment of the present invention.

FIG. 5 is a plan view of the semiconductor device according to an embodiment of the present invention. In FIG. 5, an input/output cell region 4 is disposed around an internal cell region 2 positioned at the center. Each cell 4A in the input/output cell region 4 can be used as an input cell, output cell, or input-output cell having both functions, depending on the wiring of the transistors in the cell.

Figure 6:
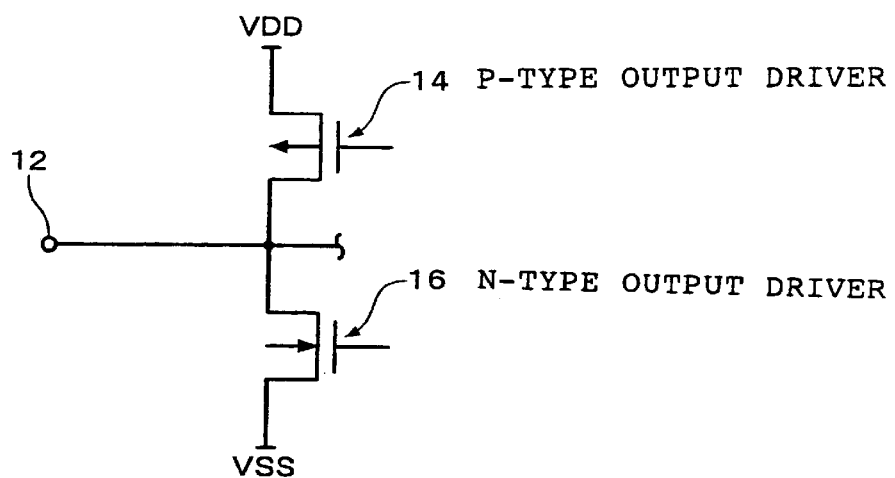
FIG. 6 is an equivalent circuit diagram of the output driver in one of the output cells shown in FIG. 5.

FIG. 6 shows an output cell 10, which is one of the plurality of cells 4A shown in FIG. 5.

The output cell 10 comprises an output terminal 12, a p-type output driver 14 formed of p-type transistors connected between the output terminal 12 and a VDD potential supply line, and an n-type output driver 16 formed of n-type transistors connected between the output terminal 12 and a VSS potential supply line. In FIG. 6, other circuits such as electrostatic protection circuits are not shown.

The p-type output driver 14 is turned on when the logic HIGH is output from the output terminal 12, and the n-type output driver 16 is turned on when the logic LOW is output from the output terminal 12. The capabilities of the p-type and n-type output drivers 14 and 16 are set to the customer's requirements. Therefore, the p-type and n-type output drivers 14 and 16 are constituted by wiring one transistor or a plurality of transistors in parallel according to the current driving capability required by the customer.

Figure 1:
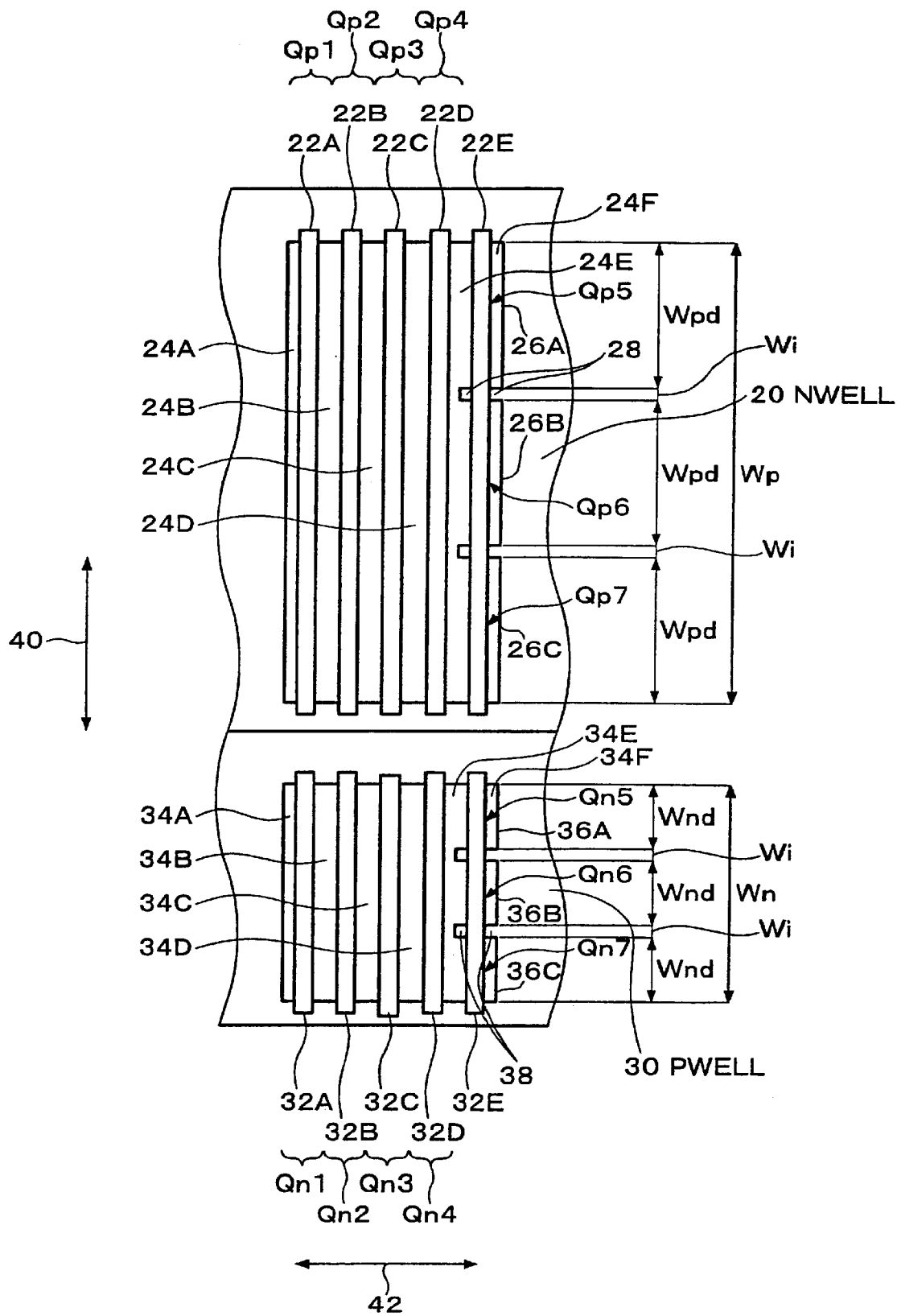
FIG. 1 is a plan view showing part of a master-slice semiconductor device according to an embodiment of the present invention in the state of a bulk substrate before wiring.

FIG. 1 shows a group of MOS transistors on a semiconductor substrate in the region of each cell 4A shown in FIG. 5 in the state of a bulk substrate before being wired. In FIG. 1, a plurality of gate electrodes, for example, five gate electrodes 22A to 22E are formed on an n-type well region 20 in the semiconductor substrate through a gate-insulating layer (not shown). In the semiconductor substrate, impurity-diffusion regions 24A to 24F are formed on both sides of each gate electrode 22A to 22E, which are self-aligned by the gate electrodes 22A to 22E, for example. These impurity-diffusion regions 24A to 24F become a source S or drain D according to the wiring thereafter. The five gate electrodes 22A to 22E have a standard width Wp.

In the semiconductor substrate, five gate electrodes 32A to 32E are formed on a p-type well region 30, and impurity-diffusion regions 34A to 34F are formed in the semiconductor substrate on both sides of each gate electrode 32A to 32E. Since an n-type transistor has a performance higher than a p-type transistor, the standard width Wn of the gate electrodes 32A to 32E is made narrower than the standard width Wp of the gate electrodes 22A to 22E.

In FIG. 1, the direction designated by a reference numeral 40 refers to the gate width direction, and the direction designated by a reference numeral 42 refers to the gate length direction. In this embodiment, the impurity-diffusion region 24F positioned on the right of the gate electrode 22E is divided into a plurality of divisional diffusion regions, for example, three divisional diffusion regions 26A, 26B, and 26C. These divisional diffusion regions 26A, 26B, and 26C are separated by element isolating insulation films 28 formed between the divisional diffusion regions. The element isolating insulation films 28 are also formed in the impurity-diffusion region 24E positioned on the left of the gate electrode 22E. The impurity-diffusion region 24E is not completely separated by the element isolating insulation films 28, which are formed halfway in the impurity-diffusion region 24E in the direction of the gate length 42.

The impurity-diffusion region 34F positioned on the right of the gate electrode 32E is divided into a plurality of divisional diffusion regions, for example, three divisional diffusion regions 36A, 36B, and 36C by element isolating insulation films 38. Part of the impurity-diffusion region 34E positioned on the left of the gate electrode 32E is also divided by the element isolating insulation films 38.

The widths of each divided portion of the gate electrode 22E corresponding to the divisional diffusion regions 26A, 26B, and 26C are denoted by Wpd. The widths of each divided portions of the gate electrode 32E corresponding to the divisional diffusion regions 36A, 36B, and 36C are denoted by Wnd.

As shown in FIG. 1, the gate electrodes 22A to 22E and the impurity-diffusion regions on both sides of each gate electrode constitute p-type transistors Qp1 to Qp4. Since the gate width of the p-type transistors Qp1 to Qp4 is Wp, and the widths of the impurity-diffusion regions which function as the source and drain are also as wide as Wp, the output driver can handle a large output current. Therefore, the p-type transistors Qp1 to Qp4 can be used to constitute an output driver with high current driving capability.

The gate electrode 22E and the impurity-diffusion regions on both sides thereof constitute three p-type transistors Qp5 to Qp7. Since the gate width of the p-type transistors Qp5 to Qp7 is Wpd, the p-type transistors Qp5 to Qp7 can handle a small current. Therefore, the p-type transistors Qp5 to Qp7 can be used to constitute an output driver with low current driving capability.

The gate electrodes 32A to 32E and the impurity-diffusion regions on both sides thereof constitute n-type transistors Qn1 to Qn4 as shown in FIG. 1. Since the gate width of these n-type transistors Qn1 to Qpn is Wn, and the widths of the impurity-diffusion regions which function as the source and drain are also as wide as Wn, the output driver can handle a large output current. Therefore, the n-type transistors Qn1 to Qn4 can be used to constitute an output driver with high current driving capability.

The gate electrode 32E and the impurity-diffusion regions on both sides thereof constitute three n-type transistors Qn5 to Qn7. Since the gate width of the n-type transistors Qn5 to Qn7 is Wnd, n-type transistors Qn5 to Qn7 can handle a small current. Therefore, the n-type transistors Qn5 to Qn7 can be used to constitute an output driver with low current driving capability.

As described above, most of the area of each input/output cell is occupied by transistors used to constitute an output driver. Therefore, standard sizes for individual transistors are determined and prepared in a library. When driving capability greater than that of each transistor is required, a plurality of standard-sized transistors may be connected in parallel. On the other hand, there are cases in which a transistor with driving capability smaller than that of one standard-sized transistor are required. Therefore, the impurity-diffusion regions of one of the transistors formed with the standard gate widths Wp and Wn are divided by slits formed of an element isolating insulation film to form transistors with low driving capability.

Figure 2:
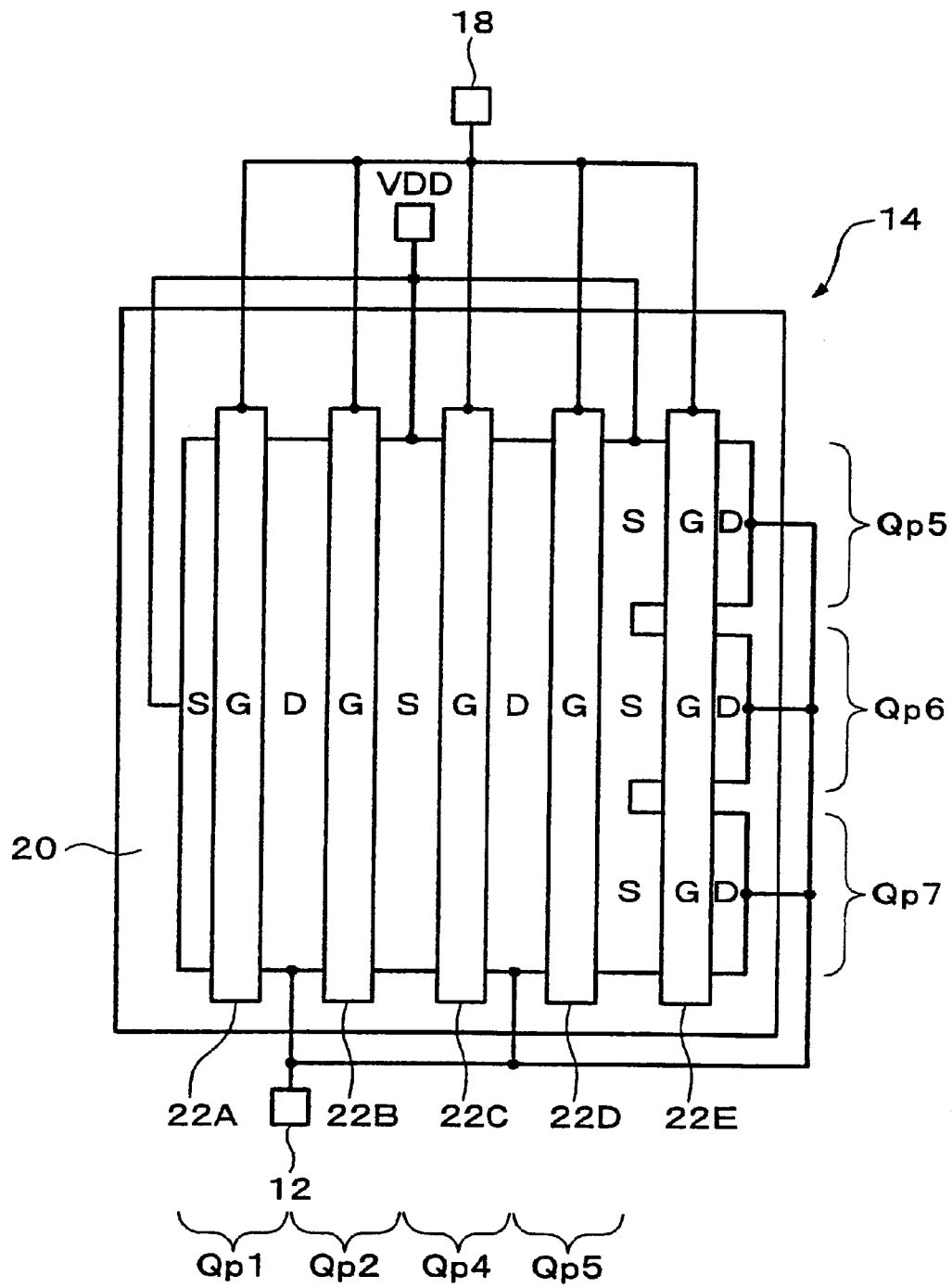
FIG. 2 is a plan view showing an example of wiring for constituting an output driver with high current driving capability by connecting the transistors shown in FIG. 1.

FIG. 2 shows an example of the wiring for connecting all the p-type transistors Qp1 to Qp7 shown in FIG. 1 in parallel to constitute the output driver 14 in FIG. 6. An equivalent circuit diagram thereof is shown in FIG. 3.

Figure 3:
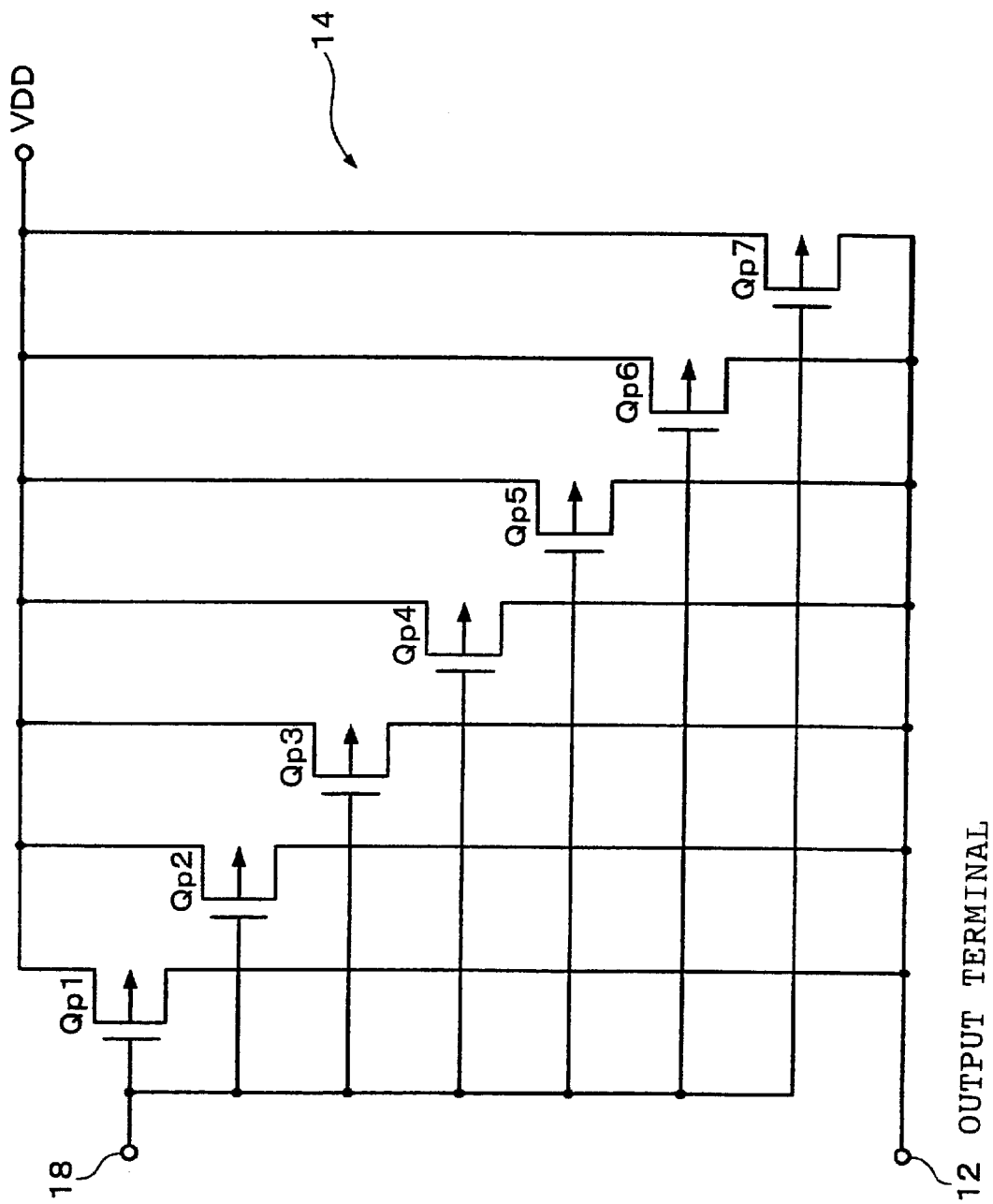
FIG. 3 is an equivalent circuit diagram of the configuration shown in FIG. 2.

As shown in FIGS. 2 and 3, the sources of the p-type transistors Qp1 to Qp7 are connected to the VDD potential supply line. The drains are connected to the output terminal 12. In this s case, the p-type transistors Qp1 to Qp7 connected in parallel are equivalent to one p-type transistor with a gate width (4×Wp+3×Wpd) and the current driving capability becomes the highest.

Figure 4:
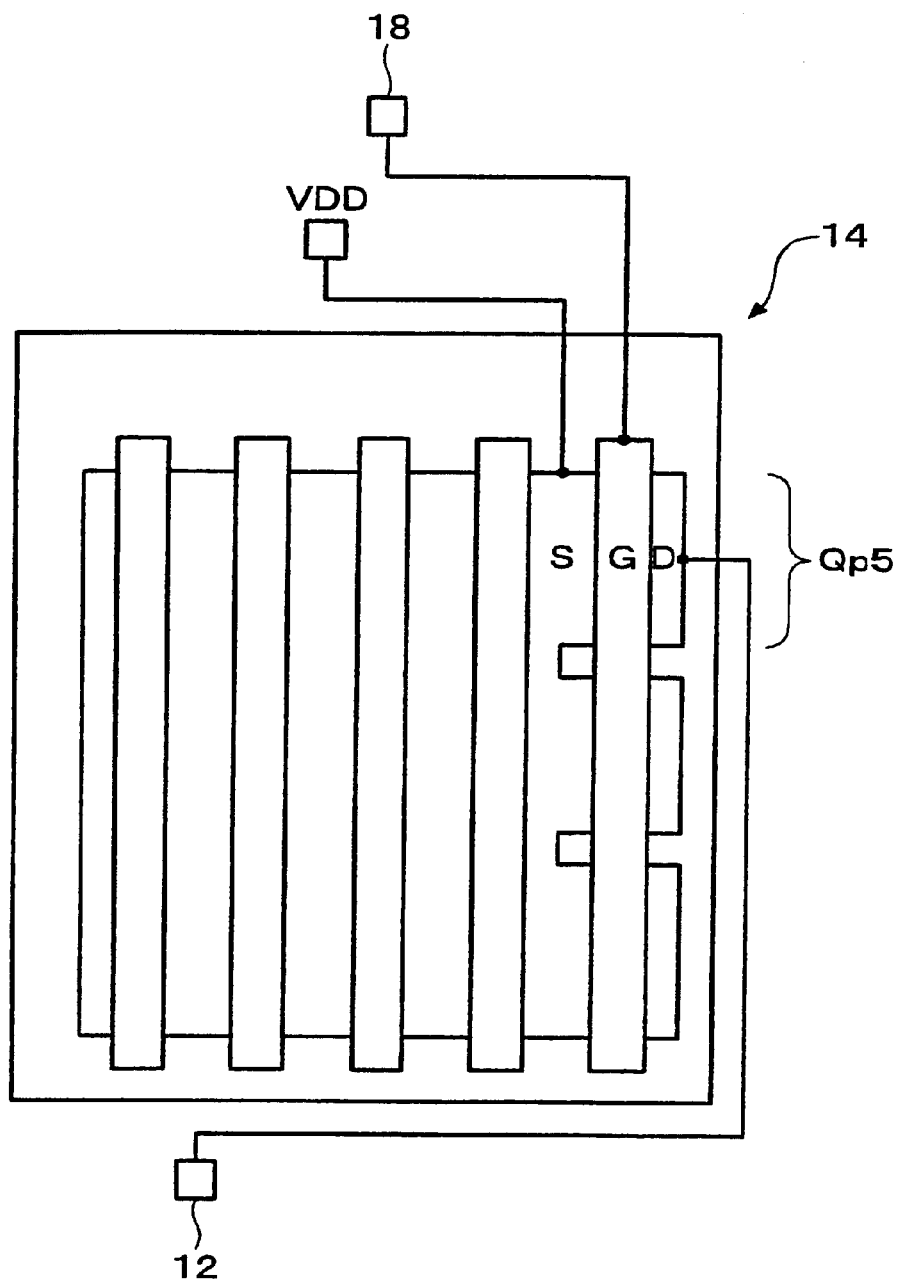
FIG. 4 is a plan view showing an example of wiring for constituting an output driver with low current driving capability by connecting the transistors shown in FIG. 1.

FIG. 4 shows an example in which only the p-type transistor Qp5 shown in FIG. 1 is connected. In this case, since the gate width of the p-type transistor Qp5 is Wpd, the current driving capability becomes the lowest.

In FIGS. 1, 2, and 4, the width Wi of the element isolating insulation films 28 and 38 is drawn wide for explanation. In actual application, the width Wi can be made as narrow as possible in comparison with the standard gate widths Wp and Wn. In practice, when the gate width Wp is 72 $\mu$m, the width Wi of the element isolating insulation films 28 can be as narrow as about 1 $\mu$m. Under such conditions, 3×Wpd is almost equivalent to Wp.

The current driving capabilities of the p-type output driver 14 constituted by connecting different transistors selected from the p-type transistors Qp1 to Qp7 in FIG. 1 are shown in Table 1. Table 1 shows the ratio of the current driving capability of the possible connections to that of the example connection in FIG. 2.

TABLE 1

| Transistors Connected | Current Driving Capability in Ratio |
|---|---|
| All | 1 |
| Qp1 to Qp6 | 14/15 |
| Qp1 to Qp5 | 13/15 |
| Qp1 to Qp4 | 12/15 |
| Qp1 to Qp3, Qp5, Qp6 | 11/15 |
| Qp1 to Qp3, Qp5 | 10/15 |
| Qp1 to Qp3 | 9/15 |
| Qp1, Qp2, Qp5, Qp6 | 8/15 |
| Qp1, Qp2, Qp5 | 7/15 |
| Qp1, Qp2 | 6/15 |
| Qp1, Qp5, Qp6 | 5/15 |
| Qp1, Qp5 | 4/15 |
| Qp1 | 3/15 |
| Qp5, Qp6 | 2/15 |
| Qp5 | 1/15 |

By dividing the gate electrode so that the widths of the divisional diffusion regions 26A to 26C are equal, the p-type output driver 14 having various current driving capabilities can be constituted by wiring as shown in Table 1. The n-type output driver 16 can also be constituted in the same manner as the p-type output driver 14.

Figure 7:
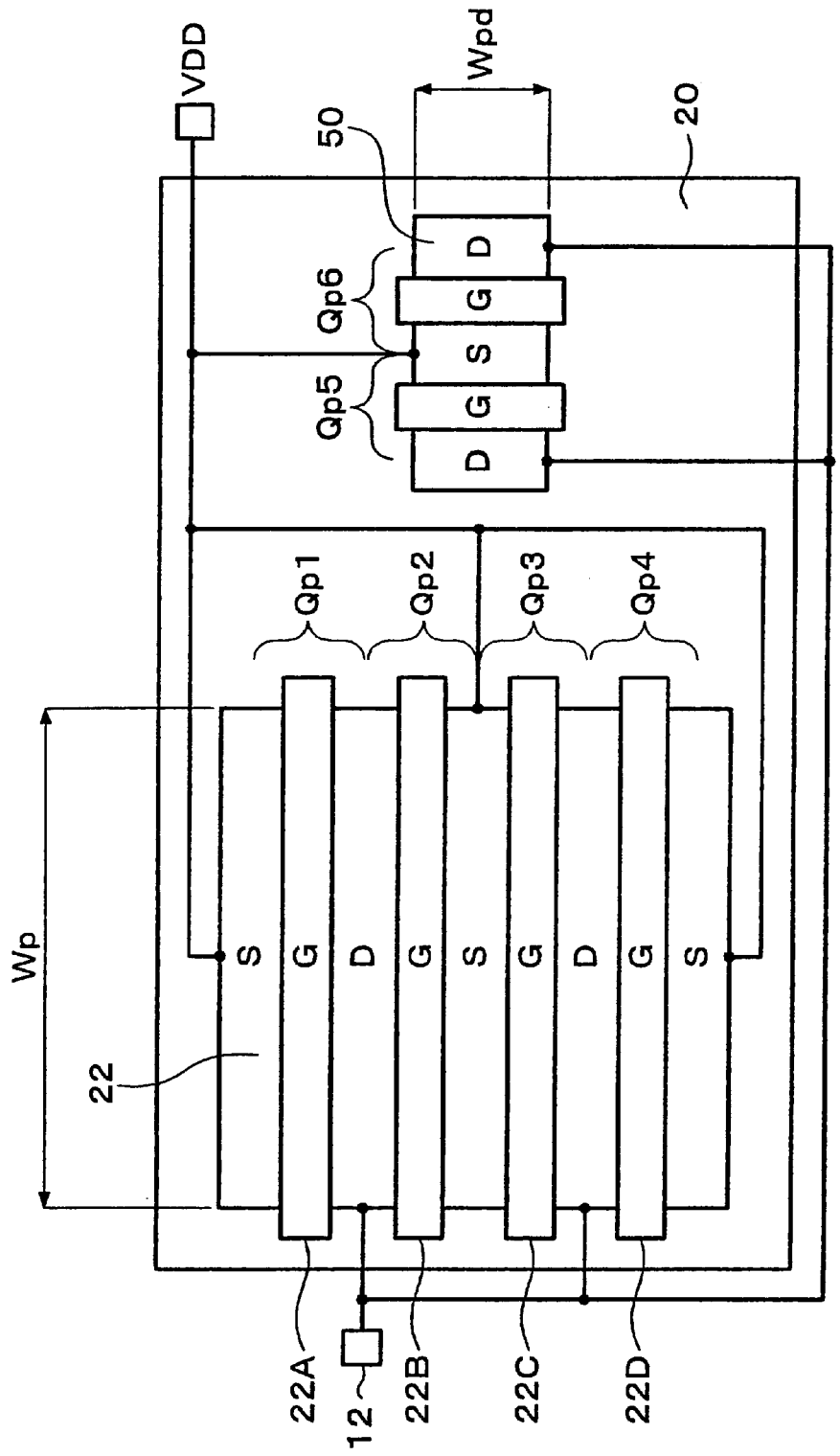
FIG. 7 is a plan view showing part of the semiconductor device which is a comparative example of the present invention.

Next, the reason why the above embodiment can reduce the chip area will be described referring to a comparative example shown in FIG. 7. In FIG. 7, members having the same functions as in FIG. 1 are designated by the same reference numerals as shown in FIG. 1. FIG. 7 shows only the group of transistors used to constitute the p-type output driver 14 shown in FIG. 6.

In FIG. 7, p-type transistors Qp1 to Qp4 are formed of four gate electrodes 22A to 22D with a gate width Wp and impurity-diffusion regions on both sides thereof in the same manner as in the embodiment shown in FIG. 1. Two p-type transistors Qp5 and Qp6 with a gate width Wpd are also formed in FIG. 7. However, these p-type transistors Qp5 and Qp6 are formed in another region 50 as shown in FIG. 7, instead of using the divisional diffusion regions formed by dividing the impurity-diffusion regions.

In the configuration shown in FIG. 7, a p-type output driver 14 with various driving capabilities can be constituted by changing the combination of transistors connected in parallel in the same manner as in FIG. 1. However, as apparent from the comparison of the areas for PMOS regions in FIGS. 1 and 7, the configuration in FIG. 1 occupies a smaller area.

What is claimed is:

1. A master-slice semiconductor device in which a lot of transistors are formed on a semiconductor substrate, transistors selected from the lot of transistors being connected by wiring, the master-slice semiconductor device comprising:

an input/output cell region disposed in a peripheral part of the semiconductor device; and an internal cell region disposed inside the input/output cell region, wherein a plurality of output cells are disposed in the input/output cell region;

wherein an output terminal and a plurality of transistors are disposed in each of the output cells, with at least on transistor selected from the plurality of transistors being connected to the output terminal;

wherein each of the plurality of transistors comprises:

a gate electrode formed on the semiconductor substrate through a gate-insulating film; and two diffusion regions formed at the semiconductor substrate on both sides of the gate electrode; and wherein one of the diffusion regions of at least one of the plurality of transistors is divided into a plurality of divisional diffusion regions in a direction of the width of the gate electrode.

2. The master-slice semiconductor device according to claim 1, wherein an element isolation region is disposed between the adjacent divisional diffusion regions.

3. The master-slice semiconductor device according to claim 2, wherein the other of the diffusion regions on both sides of the gate electrode has a region divided by the element isolation region at a portion near the gate electrode, and a region other than the divided region is continuous in the direction of the gate width.

4. The master-slice semiconductor device according to claim 2, wherein the element isolation region is formed of an element isolating insulation film.

5. The master-slice semiconductor device according to claim 1, wherein the gate electrode of each of the plurality of transistors is disposed in parallel, and the diffusion regions between two gate electrodes are used as one of a common source and a common drain of two transistors.

6. The master-slice semiconductor device according to claim 5, wherein the plurality of divisional diffusion regions are formed in an endmost impurity diffusion region.

7. The master-slice semiconductor device according to claim 1, wherein one of the divisional diffusion regions having the smallest width forms a transistor having the smallest current driving capability together with the electrode and the other of the diffusion regions.

8. The master-slice semiconductor device according to claim 7, wherein each of the divisional diffusion regions has the same width.

9. The master-slice semiconductor device according to claim 7, wherein each of the divisional diffusion regions has different width.

10. The master-slice semiconductor device according to claim 1, wherein at least one of the divisional diffusion regions in at least one of the output cells is a drain region to be connected to the output terminal by wiring.

11. The master-slice semiconductor device according to claim 1, wherein each of the output cells comprises:

a first output driver disposed between the output terminal and a VDD potential supply line; and a second output driver disposed between the output terminal and a VSS potential supply line, and wherein each of the first and second output drivers comprises the plurality of transistors.

12. The master-slice semiconductor device according to claim 11, wherein the first output driver is formed by wiring at least one transistor selected from a plurality of p-type transistors.

13. The master-slice semiconductor device according to claim 11, wherein the second output driver is formed by wiring at least one transistor selected from a plurality of n-type transistors.

14. A master-slice semiconductor device comprising:

an input/output cell region disposed in a peripheral part of the semiconductor device;

an internal cell region disposed inside the input/output cell region;

wherein a plurality of output cells are disposed in the input/output cell region;

an output terminal and a plurality of transistors both disposed in the output cells with a least one transistor selected from the plurality of transistors being connected to the output terminal and the transistors being connected by wiring;

a gate electrode formed on the semiconductor substrate through a gate-insulating film; and two diffusion regions formed at the semiconductor substrate on both sides of the gate electrode;

wherein one of the diffusion regions of at least one of the plurality of transistors is divided into a plurality of divisional diffusion regions in a direction of the width of the gate electrode.

15. The master-slice semiconductor device according to claim 14, wherein an element isolation region is disposed between the adjacent divisional diffusion regions.

16. The master-slice semiconductor device according to claim 15, wherein the other of the diffusion regions on both sides of the gate electrode has a region divided by the element isolation region at a portion near the gate electrode, and a region other than the divided region is continuous in the direction of the gate width.

17. The master-slice semiconductor device according to claim 15, wherein the element isolation region is formed of an element isolating insulation film.

18. The master-slice semiconductor device according to claim 15, wherein the gate electro de of each of the plurality of transistors is disposed in parallel, and impurity-diffusion regions between two gate electrodes are used as one of a common source and a common drain of two transistors.

19. The master-slice semiconductor device according to claim 17, wherein the plurality of divisional diffusion regions are formed in an endmost impurity diffusion region.

20. The master-slice semiconductor device according to claim 15, wherein one of the divisional diffusion regions having the smallest width forms a transistor having the smallest current driving capability together with the electrode and the other of the diffusion regions.

21. The master-slice semiconductor device according to claim 19, wherein each of the divisional diffusion regions has the same width.

22. The master-slice semiconductor device according to claim 19, wherein each of the divisional diffusion regions has different width.

23. The master-slice semiconductor device according to claim 15, wherein at least one of the divisional diffusion regions in at least one of the output cells is a drain region to be connected to the output terminal by wiring.

24. The master-slice semiconductor device according to claim 15, wherein each of the output cells comprises:

a first output driver disposed between the output terminal and a VDD potential supply line; and a second output driver disposed between the output terminal and a VSS potential supply line, and wherein each of the first and second output drivers comprises the plurality of transistors.

25. The master-slice semiconductor device according to claim 23, wherein the first output driver is formed by wiring at least one transistor selected from a plurality of p-type transistors.

26. The master-slice semiconductor device according to claim 23, wherein the second output driver is formed by wiring at least one transistor selected from a plurality of n-type transistors.

* * * * *

UNITED STATES PATENT AND TRADEMARK OFFICE
CERTIFICATE OF CORRECTION

PATENT NO. : 6,384,434 B1
APPLICATION NO. : 09/599358
DATED : May 7, 2002
INVENTOR(S) : Satoshi Ito It is certified that error appears in the above-identified patent and that said Letters Patent is hereby corrected as shown below:

On title page add:

Item (30) Foreign Application Priority Data

Jul. 7, 1999     (JP) ...................... H11-193140

Jun. 2, 2000     (JP) ....................... 2000-165879

Signed and Sealed this

Twenty-first Day of August, 2007

JON W. DUDAS
*Director of the United States Patent and Trademark Office*